United States Patent
Iida et al.

(10) Patent No.: US 6,334,896 B1
(45) Date of Patent: Jan. 1, 2002

(54) SINGLE-CRYSTAL SILICON WAFER HAVING FEW CRYSTAL DEFECTS AND METHOD FOR MANUFACTURING THE SAME

(75) Inventors: Makoto Iida; Masanori Kimura; Shozo Muraoka, all of Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/600,033

(22) PCT Filed: Nov. 11, 1999

(86) PCT No.: PCT/JP99/06287

§ 371 Date: Jul. 11, 2000

§ 102(e) Date: Jul. 11, 2000

(87) PCT Pub. No.: WO00/31324

PCT Pub. Date: Jun. 2, 2000

(30) Foreign Application Priority Data

Nov. 19, 1998 (JP) .......................................... 10-329309

(51) Int. Cl.⁷ .............................................. C30B 15/04
(52) U.S. Cl. .......................... 117/20; 117/13; 423/328.1
(58) Field of Search ................... 117/13, 20; 423/328.1

(56) References Cited

U.S. PATENT DOCUMENTS 6,077,343 A * 6/2000 Iida et al. ...................... 117/2
6,190,452 B1 * 2/2001 Sakurada et al. ............. 117/20

FOREIGN PATENT DOCUMENTS

JP  A-8-330316  12/1996
JP  A-11-147786  6/1999

OTHER PUBLICATIONS

Japanese Journal of Applied Physics, Part 1 Regular Papers, Short Notes & Review Papers, Sep. 1993 vol. 32 No. 9A.

* cited by examiner

Primary Examiner—Felisa Hiteshew
(74) Attorney, Agent, or Firm—Oliff & Berridge, PLC

(57) ABSTRACT

A method for producing a silicon single crystal, wherein, when a silicon single crystal is grown by the Czochralski method, the crystal is pulled with such conditions as present in a region defined by a boundary between a V-rich region and an N-region and a boundary between an N-region and an I-rich region in a defect distribution chart showing defect distribution which is plotted with D [mm] as abscissa and F/G [mm²/° C.·min] as ordinate, wherein D represents a distance between center of the crystal and periphery of the crystal, F/G [mm/min] represents a pulling rate and G [° C./mm] represents an average temperature gradient along the crystal pulling axis direction in the temperature range of from the melting point of silicon to 1400° C., and time required for crystal temperature to pass through the temperature region of from 900° C. to 600° C. is controlled to be 700 minutes or shorter, and a silicon single crystal wafer grown by the Czochralski method, which is a silicon single crystal wafer having N-region for its entire plane, and does not generate OSFs by a single-step thermal oxidation treatment, but generates OSFs by a two-step thermal oxidation treatment. According to the method, a silicon single crystal wafer of an extremely low defect density, which has the N-region for the entire plane of the crystal, is obtained by the CZ, while maintaining high productivity.

6 Claims, 3 Drawing Sheets

SINGLE-CRYSTAL SILICON WAFER HAVING FEW CRYSTAL DEFECTS AND METHOD FOR MANUFACTURING THE SAME

TECHNICAL FIELD

The present invention relates to a silicon single crystal wafer having few crystal defects, in particular, no OSF ring, and an N-region over its entire plane, and a method for producing the same.

BACKGROUND ART

In recent years, with the use of finer semiconductor devices required for higher integration level of semiconductor devices, there has been desired increasingly higher quality of silicon single crystals produced by the Czochralski method (abbreviated as CZ method hereinafter) and used for substrates of the devices. In particular, such crystals have defects introduced during the crystal growth, which are called grown-in defects such as FPD, LSTD and COP, and degrade the oxide dielectric breakdown voltage and other device characteristics, and it is considered important to reduce the density and the size of the defects.

For the reference of the explanation of those defects, there will be given first general knowledge of factors determining densities of defects introduced into silicon single crystals, a void type point defect called vacancy (occasionally abbreviated as V hereinafter), and an interstitial type silicon point defect called interstitial silicon (occasionally abbreviated as I hereinafter).

In a silicon single crystal, a V-region means a region containing many vacancies, i.e., depressions, pits and the like generated due to missing of silicon atoms, and an I-region means a region containing many dislocations and aggregations of excessive silicon atoms generated due to the presence of excessive amount of silicon atoms. Between the V-region and the I-region, there should be a neutral (occasionally abbreviated as N hereinafter) region with no (or little) shortage or no (or little) surplus of the atoms. It has become clear that the aforementioned grown-in defects (FPD, LSTD, COP etc.) should be generated strictly only with supersaturated V or I, and they would not be present as defects even though there is little unevenness of atoms so long as V or I is not saturated.

The densities of these two kinds of point defects are determined by the relationship between the crystal pulling rate (growing rate), and the temperature gradient G in the vicinity of the solid-liquid interface in the crystal in the CZ method. It has been confirmed that defects distributed in a ring shape called OSFs (Oxidation Induced Stacking Fault, the ring may be referred to as "OSF ring" hereinafter) are present around the boundary between the V-region and the I-region in a cross section perpendicular to the crystal growing direction, and it is considered important to reduce the density and the size of these defects as defects generated during the crystal growth and degrading the oxide dielectric breakdown voltage and other device characteristics.

Those defects generated during the crystal growth are categorized as follows. When the growth rate is relatively high, i.e., around 0.6 mm/min or higher, grown-in defects considered to be originated from voids, i.e., aggregations of void-type point defects, such as FPD, LSTD and COP are distributed over the entire plane of the crystal along the radial direction at a high density, and a region containing such defects is called V-rich region (see FIG. 5a). When the growth rate is 0.6 mm/min or lower, the aforementioned OSF ring is initially generated at the circumferential part of the crystal with the decrease of the growth rate, and L/Ds (large dislocations, also called interstitial dislocation loops, which include LSEPD, LFPD and the like), which are considered to be originated from dislocation loops, are present outside the ring at a low density, and a region containing such defects is called I-rich region (see FIG. 5b). When the growth rate is further lowered to around 0.4 mm/min, the OSF ring shrinks toward the center of wafer and disappears, and thus the entire plane becomes the I-rich region (FIG. 5c).

Recently, there has been discovered presence of a region called N-region containing neither the void-originated grown-in defects such as FPD, LSTD and COP, nor the dislocation loop-originated LSEPD and LFPD, which region is present between the V-rich region and the I-rich region, and outside the OSF ring (see Japanese Patent Laid-open Publication [Kokai] No. 8-330316). It was reported that this region existed outside the OSF ring, and showed substantially no oxygen precipitation observed when subjected to a heat treatment for oxygen precipitation and examined by X-ray analysis or the like as for the precipitation contrast, as well as this region was present at rather I-rich side where the defects were not so rich as to form LSEPD and LFPD (see FIG. 4a). Further, it was suggested that the N-region, which could be obtained only for an extremely small portion of a wafer obtained by a conventional CZ pulling apparatus, could be enlarged over the entire plane of wafer by improving temperature distribution in a furnace of the pulling apparatus and controlling the pulling rate, that is, by maintaining a F/G value (a ratio represented as F/G where F is a single crystal pulling rate [mm/min] and G represents an average temperature gradient along the crystal growing direction in the temperature range of from the melting point of silicon and 1300° C. [°C/mm]) within a range of from 0.20 to 0.22 mm$^2$/°C·min for the entire plane of the wafer and the entire length of the crystal (see FIG. 4b).

However, if it is attempted to produce a crystal with such a region containing extremely few defects and enlarged over the entire crystal, this region is limited to the N-region on the I-rich region side. Therefore, controllable ranges of production conditions are very narrow. However, such precise control is difficult in apparatuses for industrial production, even though it may be possible in experimental apparatuses. Thus, such production suffers from a problem concerning productivity and is not practical.

Furthermore, it was found that the defect distribution chart disclosed in the aforementioned application and the data used for it were considerably different from the data obtained by the inventors of the present invention through experiments and researches and the defect distribution chart prepared based on the data (see FIG. 1).

DISCLOSURE OF THE INVENTION

The present invention was accomplished in view of the aforementioned problem, and its object is to obtain a silicon single crystal wafer of an extremely low defect density, which has the N-region for the entire plane of the crystal and neither of V-rich region, I-rich region and OSF ring, by the CZ method with easily controllable production conditions because of wide controllable ranges thereof, while maintaining high productivity.

The present invention was accomplished in order to achieve the aforementioned object, and provides a method for producing a silicon single crystal, wherein, when a silicon single crystal is grown by the Czochralski method, the crystal is pulled with such conditions as present in a region defined by a boundary between a V-rich region and an N-region and a boundary between an N-region and an I-rich region in a defect distribution chart showing defect distribution which is plotted with D [mm] as abscissa and F/G [mm$^2$/°C·min] as ordinate, wherein D represents a distance between center of the crystal and periphery of the crystal, F [mm/min] represents a pulling rate and G [°C/mm] represents an average temperature gradient along the crystal pulling axis direction in the temperature range of from the melting point of silicon to 1400° C., and time required for crystal temperature to pass through the temperature region of from 900° C. to 600° C. is controlled to be 700 minutes or shorter.

If a crystal is pulled while the pulling rate F of the crystal and the average temperature gradient G along the crystal pulling axis direction in the temperature range of from the melting point of silicon to 1400° C. are controlled so that the conditions should be present in a region defined by a boundary between a V-rich region and an N-region and a boundary between an N-region and an I-rich region in the defect distribution chart shown in FIG. 1, which was obtained through analysis of the results of experiments and researches, as described above, OSFs would be present in the plane, as will be generated in a ring shape during a thermal oxidation treatment, and thus a grown single crystal having the N-regions for all of the portions inside and outside the OSF ring would be obtained (see FIG. 3b). However, by further controlling the thermal history of the crystal so that the time required for crystal temperature to pass through the temperature region of from 900° C. to 600° C. should be 700 minutes or shorter, generation and growth of OSF nuclei can be inhibited, and therefore the OSF ring is not generated when the wafer is subjected to OSF thermal oxidation treatment, even though nuclei for the OSF ring are latently present therein. Thus, there can be obtained a wafer of extremely low defect density having N-region over the entire plane and neither of V-rich region, I-rich region and the harmful OSF ring (see FIG. 3c).

In this case, when the silicon single crystal is grown by the Czochralski method, it is desirable that oxygen concentration in the growing crystal is controlled to be 24.0 ppma or less.

By pulling the crystal while the oxygen concentration in the growing crystal is controlled to be 24.0 ppma (value according to ASTM '79) or less as described above, generation and growth of OSF nuclei can surely be suppressed. Thus, there can be obtained a silicon single crystal wafer with extremely few crystal defects containing no OSFs, which are generated in a ring shape during the thermal oxidation treatment, even though there exist latent nuclei for the OSF ring.

The present invention also provides a silicon single crystal wafer produced from a silicon single crystal produced by the production method of the present invention. The silicon wafer obtained by the present invention is a silicon single crystal wafer having N-region for the entire plane, extremely few crystal defects and no OSF, which is generated in a ring shape during the OSF thermal oxidation treatment, while there exist latent nuclei for the OSF ring.

The present invention also provides a silicon single crystal wafer grown by the Czochralski method, which is a silicon single crystal wafer having N-region for its entire plane, and does not generate OSFs by a single-step thermal oxidation treatment, but generates OSFs by a two-step thermal oxidation treatment.

That is, the wafer of the present invention is a silicon single crystal wafer having N-region for the entire plane and extremely few crystal defects, in which latent nuclei of OSFs originally exist, and OSFs are not generated by a usual single-step thermal oxidation treatment, but the latent nuclei of OSFs are grown by a two-step thermal oxidation treatment to generate OSFs. These OSFs generated only by the two-step thermal oxidation treatment are not the defects that degrade the oxide dielectric breakdown voltage and other device characteristics in actual processes.

The present invention further provides a silicon single crystal wafer, which contains crystal portions in which oxygen is not precipitated among crystal portions in which oxygen is precipitated by an oxygen precipitation heat treatment.

Because the wafer of the present invention contains latent nuclei of OSFs, oxygen is not precipitated by the oxygen precipitation heat treatment in portions where the latent nuclei for the OSF ring are present, but oxygen is precipitated in the vicinity of such portions.

As explained above, according to the present invention, the controllable ranges of single crystal growth conditions become larger by selecting a suitable F/G value. Further, by using control of the thermal history in the low temperature region or control for obtaining low oxygen concentration in combination, there can be produced a silicon single crystal wafer having N-region for the entire plane and no crystal defects, wherein the OSF ring is not generated by a thermal oxidation treatment in spite of the presence of OSF latent nuclei and there are neither of grown-in defects and L/Ds in the plane.

BRIEF EXPLANATION OF THE DRAWINGS

FIG. 3 comprises explanatory views for illustrating defect distribution for various defects in crystal planes observed in the production method of the present invention.

FIG. 4 comprises explanatory views for illustrating defect distribution for various defects in crystal planes observed in the conventional pulling method.

FIG. 5 comprises explanatory views illustrating the relationship between the pulling rate and defect distribution in crystal planes observed in the conventional pulling method.

BEST MODE FOR CARRYING OUT THE INVENTION

Figure 1:
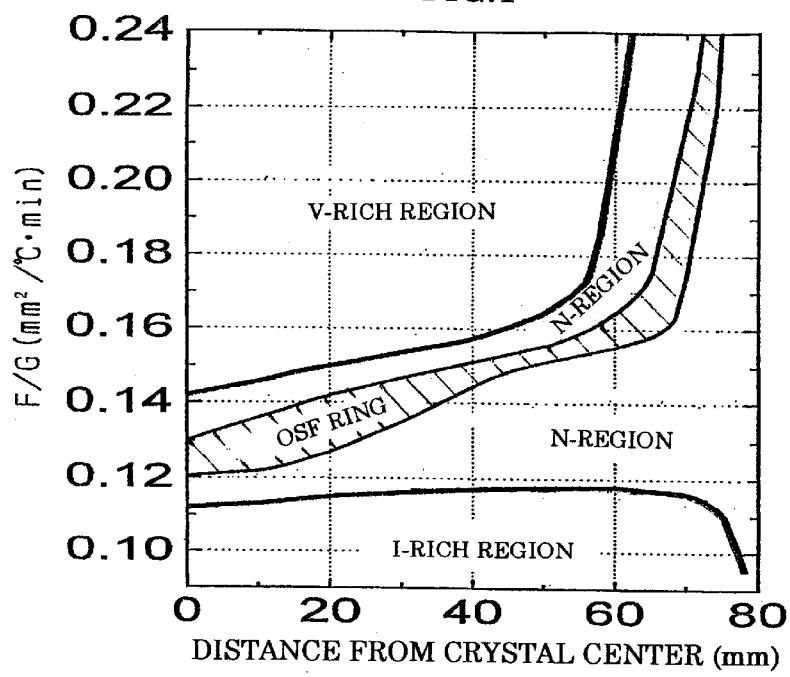
FIG. 1 is a defect distribution chart for various defects in a silicon single crystal wafer plane, in which locations along the radial direction of crystal are plotted as abscissa, and F/G values are plotted as ordinate.

The present invention will be explained in detail hereinafter, but the present invention is not limited by this explanation. Before the explanation, technical terms used herein are defined beforehand.

1) FPD (Flow Pattern Defect)

When a wafer sliced from a grown silicon single crystal ingot is subjected to etching with a mixture of hydrofluoric acid and nitric acid to remove a surface damaged layer, and surface etching with a mixture of $K_2Cr_2O_7$, hydrofluoric acid and water (Secco etching), pits and a flow pattern are formed on the wafer surface. This flow pattern is called FPDs, and a higher FPD density on the wafer surface causes more frequent oxide dielectric breakdown voltage failure (see Japanese Patent Laid-open Publication [Kokai] No. 4-192345).

2) SEPD (Secco Etch Pit Defect)

As for the FPDs generated after the aforementioned Secco etching, those accompanied by a flow pattern are called FPDs, and those not accompanied by the flow pattern are called SEPDs. Among those SEPDs, large SEPDs having a size of 10 μm or more (LSEPDs) are considered to be originated from dislocation clusters, and electric current may leak through these dislocation clusters present in devices, which leads to dysfunction of P-N junction.

3) LSTD (Laser Scattering Tomography Defect)

After a wafer is sliced from a grown silicon single crystal ingot, and subjected to etching with a mixture of hydrofluoric acid and nitric acid to remove a surface damaged layer, the wafer is cleaved. When the cleaved surface is irradiated with an infrared light, scattered lights caused by defects present in the wafer can be observed by detecting lights emitted from the wafer surface. The light-scattering substances causing this phenomenon have already been reported in academic societies and the like, and considered to be oxide precipitates (see J. J. A. P. Vol.32, p3679, 1993). More recent studies also reported that they are octahedral voids (holes).

4) COP (Crystal Originated Particle)

COPs means defects causing degradation of oxide dielectric breakdown at the center of wafer, and they are formed after SC-1 cleaning (cleaning with a mixture of $NH_4OH:H_2O_2:H_2O=1:1:10$, which serves as a selective etching solution) from defects that would otherwise be FPDs after the Secco etching. Pits of this kind have a diameter of 1 μm or less, and they are detected by the light scattering method.

5) L/D (Large Dislocation, also called interstitial dislocation loop)

Defects of this kind include LSEPD, LFPD and the like, and they are considered to originate from dislocation loops. LSEPDs refer to large ones having a size of 10 μm among SEPDs as described above. LFPDs refer to large ones having an end pit size of 10 μm or more among the aforementioned FPDs, and they are also considered to originate from dislocation loops.

As proposed in Japanese Patent Application No. 9-199415, the inventors of the present invention precisely examined the vicinity of the boundary between the V-region and the I-region, and found that, in a region in the vicinity of the boundary, there was a neutral region that had extremely few grown-in defects such as FPD, LSTD and COP and no L/D such as LSEPD and LFPD as an extremely small region.

Therefore, it was considered that if this neutral region can be enlarged over the entire plane of wafer, point defects can markedly be reduced. A major factor that determines density distribution of the point defects in a wafer plane of crystal is temperature gradient among the growing (pulling) rate and the temperature gradient, since a pulling rate is substantially constant within the plane of the crystal. That is, it was found that the problem was difference of the temperature gradient along the axis direction within the wafer plane, and if this difference could be reduced, density difference of the point defects within the wafer plane could also be reduced. Therefore, by controlling the furnace temperature and adjusting the pulling rate so that difference ΔG between temperature gradient at the crystal center portion Gc and that at the peripheral portion Ge should satisfy ΔG=(Ge−Gc)≦5° C./cm, it became possible to obtain a wafer with no defect having N-region for the entire wafer plane.

Then, as proposed in Japanese Patent Application No. 9-325428, crystal planes were examined by using a crystal pulling apparatus according to the CZ method utilizing a small difference ΔG of the temperature gradient and varying the pulling rate. As the result, the following findings were newly obtained.

Figure 3A:
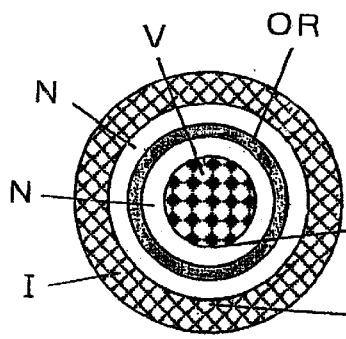
FIG. 3a shows the case where the pulling is performed with conventional pulling conditions.

Although the N-region existing between the V-rich region and the I-rich region was previously considered to be present only outside the OSF ring (nuclei), it was confirmed that the N-region also existed inside the OSF ring (see FIG. 3a). That is, according to the aforementioned Japanese Patent Application No. 9-199415, the OSF ring was the boundary region of the V-rich region and N-region (see FIG. 4a), but it was found that these two did not necessarily coincide. This was not found when the experiments were conducted by using a conventional crystal pulling apparatus where ΔG was large, but found by investigating a crystal obtained by using the aforementioned crystal pulling apparatus where ΔG was small.

The temperature in the furnace of the pulling apparatus observed in this investigation was analyzed with a great effort by using the global heat transfer analysis software FEMAG (F. Dupret, P. Nicodeme, Y. Ryckmans, P. Wouters and M. J. Crochet, Int. J. Heat Mass Transfer, 33, 1849 (1990)). As the result, it was found that, when the pulling rate F [mm/min] and the average temperature gradient G [° C./mm] within the crystal along the direction of pulling axis from the melting point of silicon to 1400° C. were controlled so that the ratio of F/G should fall within the range of 0.112–0.142 $mm^2/°$ C. at the crystal center, a single crystal silicon wafer having no grown-in defect and no L/D for the entire wafer plane could be obtained, even though a OSF ring was generated in a ring shape during the OSF thermal oxidation treatment or there existed nuclei for the OSF ring.

FIG. 1 shows distributions of various defects for a silicon single crystal having a diameter of 6 inches as an example, where locations along the radial direction of the crystal are plotted as abscissa and F/G values are plotted as ordinate. As is clear from FIG. 1, in order to utilize the N-region to the maximum extent within the wafer containing the OSF ring, the F/G value can be controlled to be within the range of 0.112–0.142 $mm^2/°$ C.·min at the crystal center.

Figure 4A:
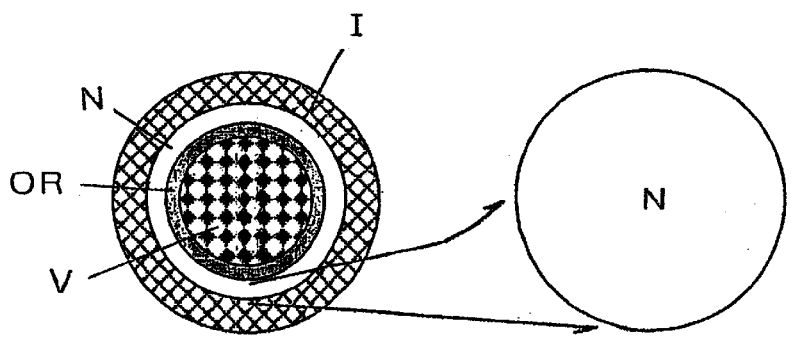
FIG. 4a shows the case where the pulling is performed with conventional pulling conditions.
Figure 4B:
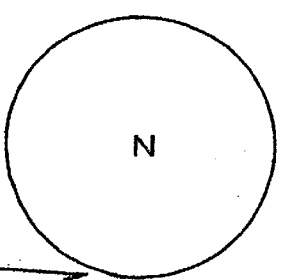
FIG. 4b shows the case where the pulling rate and the temperature gradient in the crystal are precisely controlled.
Figure 5A:
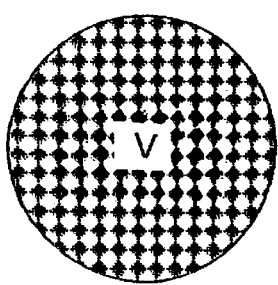
FIG. 5a shows the case where the pulling is performed at a high pulling rate.
Figure 5B:
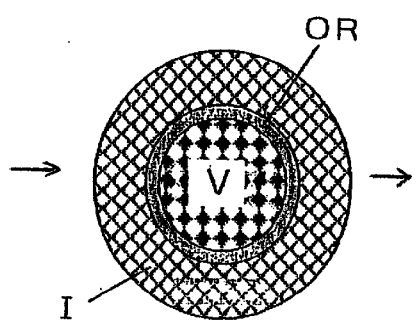
FIG. 5b shows the case where the pulling is performed at a medium pulling rate.
Figure 5C:
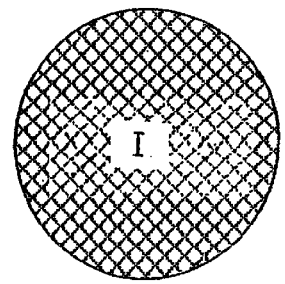
FIG. 5c shows the case where the pulling is performed at a low pulling rate.

This will be explained with respect to a wafer plane. As shown in FIG. 4a, the pulling rate and ΔG have been conventionally controlled by using a special crystal pulling apparatus so as to enlarge the N-region, which exists outside the OSF ring when the crystal is pulled at a usual pulling rate in an usual crystal pulling apparatus (see FIG. 4b), over the entire crystal plane in order to produce a crystal with no defect. However, controllable ranges of the conditions such as the pulling rate and the temperature gradient are very narrow, and hence difficult to be controlled. This causes a problem concerning productivity, and thus the method is less practical.

Figure 3B:
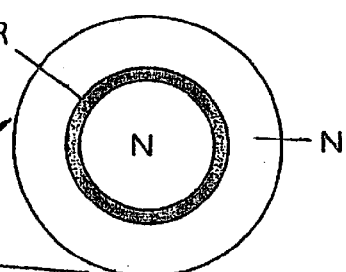
FIG. 3b shows the case where the pulling is performed with the conditions present between the V-rich region and I-rich region.
Figure 3C:
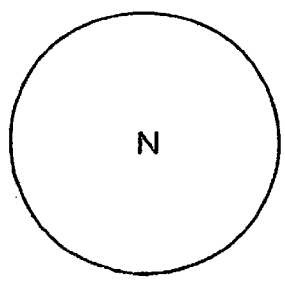
FIG. 3c shows the case where the pulling is performed with pulling conditions of the present invention.

Therefore, it was attempted to enlarge the N-region to the maximum extent by using not only the N-region outside the OSF ring but also the N-region existing inside the OSF ring (see FIG. 3a). That is, as shown in FIG. 3b, a crystal was pulled with a pulling rate, ΔG and a crystal pulling apparatus that are selected so that the N-region can be enlarged to the maximum extent over the entire wafer plane while the OSF ring is left to be contained. As a result, when the crystal was pulled by adjusting the pulling rate and the temperature gradient in the crystal so that the F/G value should be within the aforementioned range thereof, a wafer of few defects could easily be produced under production conditions with wider controllable ranges of the production conditions compared with the conventional methods.

With regard to the OSF ring, it has been found that from the latest researches that, when the oxygen concentration is low in the entire plane of the wafer, the OSF ring is not generated by a thermal oxidation treatment even if nuclei for the OSF ring exist, and thus devices are not affected.

The threshold value of this oxygen concentration was confirmed by pulling crystals of several kinds of oxygen concentration levels using the same crystal pulling apparatus, and it is confirmed that if the oxygen concentration in the entire wafer plane is 24.0 ppma (value according to ASTM'79) or less, the OSF ring is not generated by a thermal oxidation treatment of the wafer.

That is, when the oxygen concentration is gradually lowered while pulling one crystal, the OSF ring is observed after a thermal oxidation treatment of the wafer until the oxygen concentration reaches 24.0 ppma with the presence of OSF nuclei for the entire length of the crystal. At the concentration of 24.0 ppma or less, however, the OSF ring is not observed after a thermal oxidation treatment although latent nuclei for the OSF ring exist.

In order to obtain the oxygen concentration of 24.0 ppma or less during the crystal growth, a conventional method generally used in the art can be employed. For example, it can easily be attained by adjusting a rotation number of the crucible or temperature distribution in the melt to control convection of the melt.

Although oxygen precipitation tends to decrease in a portion where the nuclei for the OSF ring exists but the OSF ring is not generated, such little oxygen precipitation in the OSF region dose not cause a problem, because strong gettering is not required in a low temperature process for device production.

Then, crystal growth conditions inhibiting the growth of OSF ring nuclei were examined. By using several kinds of crystal pulling apparatuses with different temperature distributions in the furnace (structure of the furnace was changed), crystals were pulled while controlling the pulling rate so that the OSF ring should be generated upon the OSF thermal oxidation treatment. As a result, the OSF ring was not observed in a crystal that received a thermal history where the crystal passed through a temperature region of 900–600° C. in 645 minutes, even after it was subjected to a subsequent OSF thermal oxidation treatment for confirming generation of the OSF ring.

However, in a crystal that received a thermal history where the crystal passed through a temperature region of 900–600° C. in 770 minutes, the OSF ring was generated after it was subjected to a subsequent OSF thermal oxidation treatment for confirming generation of the OSF ring.

Figure 2:
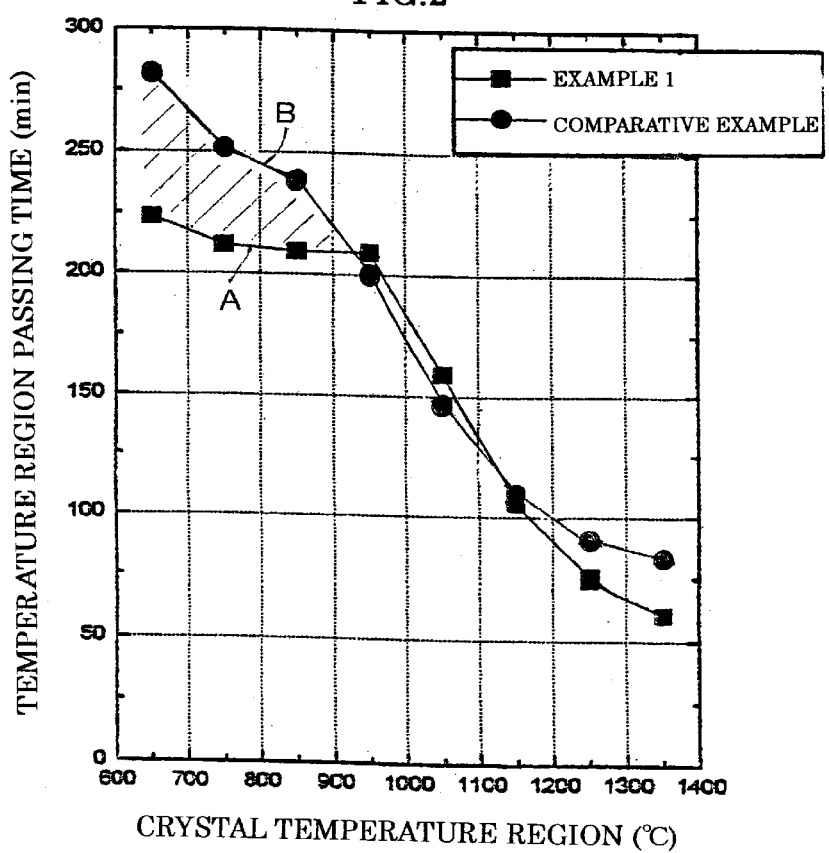
FIG. 2 is an explanatory graph representing variation of time required for the growing crystal to pass through each temperature region of 100° C. interval for Example 1 and Comparative Example.

FIG. 2 shows comparison of the case where time of passing through each of the crystal temperature regions, which consist of regions of 100° C. interval, was controlled (Curve A) and the case where a crystal was grown without controlling the time (Curve B).

In FIG. 2, it is evident that the OSF ring was generated with the passing time of Curve B plotted with solid circles (sum of the three regions is 770 minutes), whereas it was not generated with the passing time of Curve A plotted with solid squares (sum of the three regions is 645 minutes). Therefore, it is considered that the temperature region of from 900° C. to 600° C. should be the growth region of latent nuclei for the OSF ring.

Accordingly, it is preferable to make the time of passing through this region shorter as much as possible. Further, it is also considered that the latent nuclei are generated in the temperature region of 1100–900° C.

Therefore, by controlling the thermal history so that the time required for crystal temperature to pass through the temperature region of from 900° C. to 600° C. during the crystal growth should be 700 minutes or less to inhibit growth of OSF ring nuclei after pulling the crystal with the controlled F/G value, a crystal with no defects, which has OSF latent nuclei but does not generate the OSF ring during the OSF thermal oxidation treatment, contains neither of grown-in defects and L/D, and has the N-region for the entire plane as a usable region, can be produced with conditions of wide controllable ranges. In addition, by suppressing the oxygen concentration to a level of 24.0 ppma or less, generation of the OSF ring can surely be suppressed.

That is, a wafer with no defects and usable plane for the entire plane, which has the N-region for the entire plane and OSF latent nuclei but does not generate the OSF ring during the thermal oxidation treatment, can be produced with conditions of wide controllable ranges by controlling the F/G value, where F [mm/min] is a pulling rate and G [° C./mm] is an average temperature gradient along the crystal pulling direction in the temperature range of from the melting point of silicon to 1400° C., to be 0.112–0.142 $mm^2/°C.\cdot min$ at the center of the crystal and time required for crystal temperature to pass through the temperature region of from 900° C. to 600° C. to be 700 minutes or shorter in a method for producing a silicon single crystal by the CZ method. In this case, by further suppressing the oxygen concentration during the crystal growth to be 24.0 ppma or less, growth of OSF latent nuclei can be suppressed and generation of OSF ring can surely be suppressed.

Further, as a silicon single crystal wafer grown by the Czochralski method, for example, a wafer produced by the aforementioned method of the present invention becomes a silicon single crystal wafer which has the N-region for the entire plane and does not generate OSF by a single-step thermal oxidation treatment, but generates OSF by a two-step thermal oxidation treatment.

The single-step thermal oxidation treatment is a usual OSF test, and it is performed by a method wherein the temperature is elevated under wet oxygen atmosphere, maintained at 1150° C. for 100 minutes, and then lowered. If OSFs are generated in this test, device characteristics would be adversely affected.

The two-step thermal oxidation treatment is a method for evaluating quality of silicon single crystals disclosed in Japanese Patent Laid-open Publication (Kokai) No. 6-97251. This method is performed by a method wherein the temperature is maintained at 1000° C. for 3 hours under oxygen atmosphere as the first step, and the temperature was elevated from 1000° C. to 1150° C. under wet oxygen atmosphere, maintained at 1150° C. for 100 minutes, and then lowered for the second step. This method is a more accelerated method for finding existence of OSF nuclei, and OSFs generated only by this two-step thermal oxidation treatment do not constitute defects that degrade the oxide dielectric breakdown voltage and other device characteristics.

Density of OSF generated by this forcible two-step thermal oxidation treatment is caused just only by the acceleration for revealing the existence of nuclei. Such a condition is not usually realized in the production of devices.

Further, in such a single crystal silicon wafer, there are crystal portions in which oxygen is not precipitated among crystal portions in which oxygen is precipitated by an oxygen precipitation heat treatment.

This is because oxygen is hardly precipitated by the oxygen precipitation heat treatment in portions where the latent nuclei for the OSF ring are present, but oxygen is precipitated in the vicinity of such portions.

The present invention will be explained in more detail hereinafter with reference to the appended drawings.

Figure 6:
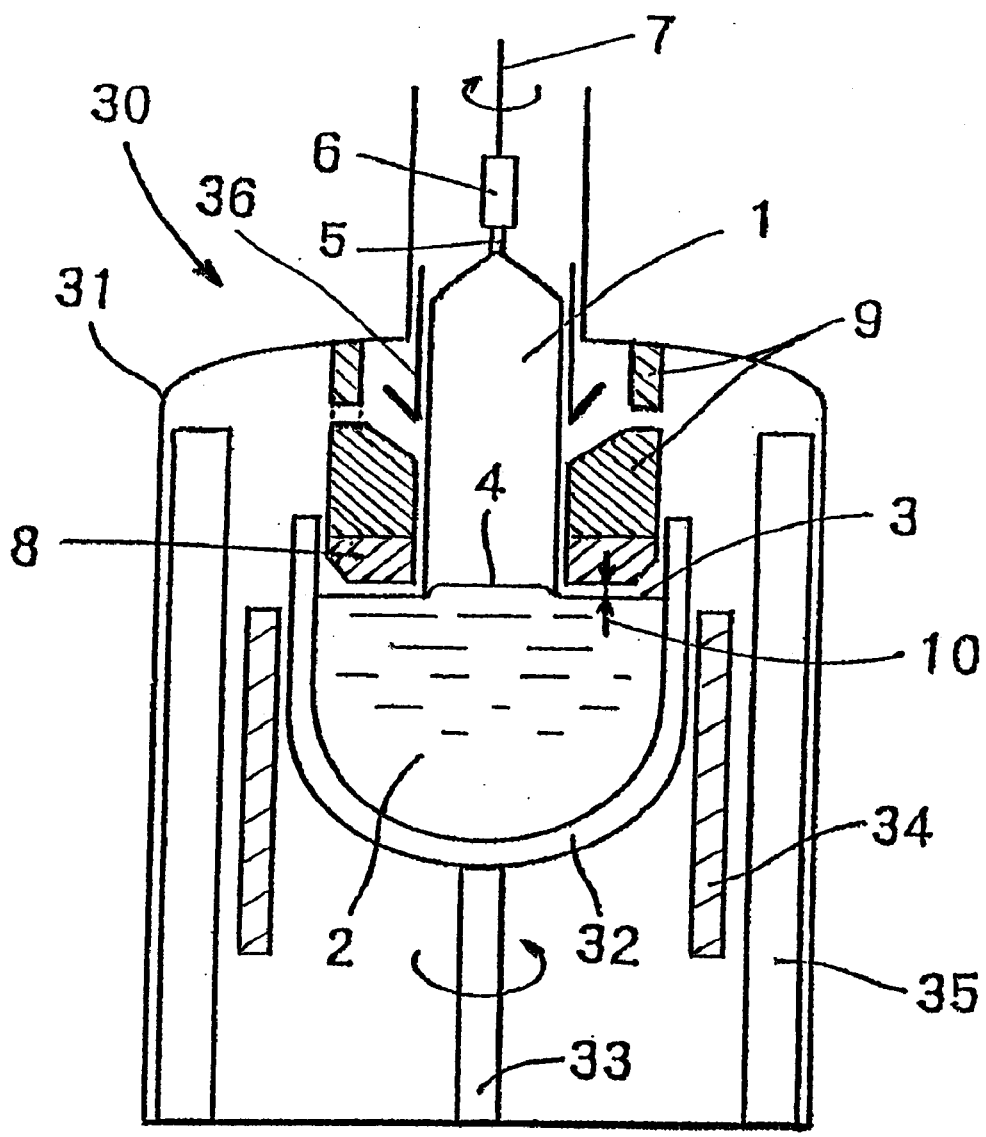
FIG. 6 is a schematic explanatory view of an apparatus for pulling a single crystal by the CZ method used in the present invention.

First, an example of an apparatus for pulling a single crystal by the CZ method used for the present invention will be explained by referring to FIG. 6. As shown in FIG. 6, the apparatus for pulling a single crystal 30 is constituted by a pulling chamber 31, crucible 32 provided in the pulling chamber 31, heater 34 disposed around the crucible 32, crucible-holding shaft 33 for rotating the crucible 32 and rotation mechanism therefor (not shown), seed chuck 6 for holding a silicon seed crystal 5, wire 7 for pulling the seed chuck 6, and winding mechanism (not shown) for rotating and winding the wire 7. The crucible 32 is composed of an inner quartz crucible for accommodating a silicon melt (molten metal) 2, and an outer graphite crucible. Further, a heat insulating material 35 surrounds the outside of the heater 34.

Further, in order to establish the production conditions used for the production method of the present invention, an annular solid-liquid interface heat insulating material 8 is provided around the periphery of the solid-liquid interface 4 of the crystal, and an upper surrounding heat insulating material 9 is provided thereon. This solid-liquid interface heat insulating material 8 is provided so as to form a gap 10 of 3–5 cm between its lower end and the surface 3 of silicon melt 2. The upper surrounding heat insulating material 9 may not be used depending on the conditions. Further, a cylindrical cooling apparatus 36 may be provided for cooling the single crystal by blowing cooling gas or shielding the radiant heat.

The so-called MCZ method is recently often used, in which a non-illustrated magnet is additionally installed outside the pulling chamber 31 in the horizontal direction, and a horizontal or vertical magnetic field is applied on the silicon melt 2 so as to prevent the convection of the melt and realize stable growth of the single crystal.

Now, the method for growing a single crystal by the aforementioned apparatus 30 for pulling single crystals will be explained hereinafter.

First, a silicon polycrystal material of high purity is melted in the crucible 32 by heating to a temperature higher than the melting point (about 1420° C.). Then, a tip end of the seed crystal 5 is brought into contact with, or immersed into the surface of the melt 2 at its approximate center portion by reeling out the wire 7. Subsequently, the crucible-holding shaft 33 is rotated in an optional direction, and at the same time the seed crystal 5 is pulled upwardly by winding up the wire 7 with rotating the wire to start the growing of single crystal. Thereafter, a single crystal ingot 1 approximately in a cylindrical shape can be obtained by suitably controlling the pulling rate and temperature.

In this case, particularly important characteristics for the temperature control according to the present invention are that, as shown in FIG. 6, an annular solid-liquid interface heat insulating material 8 is provided in a temperature region of from 1420° C. to 1400° C. of the space surrounding a liquid portion of the single crystal ingot 1 above the melt surface in the pulling chamber 31, and the upper surrounding heat insulating material 9 is provided thereon. Furthermore, there may be provided an apparatus for cooling the crystal such as a cooling apparatus 36 above the heat insulating material as required so that the crystal can be cooled by blowing cooling gas from above, and a radiant heat reflector may also be attached to the lower part of the cylinder.

By providing the heat insulating material at a location above the melt surface with a predetermined gap, and the apparatus for cooling the crystal above the heat insulating material, heat reserving effect by radiant heat can be obtained in the vicinity of the growing surface of the crystal, whereas cooling can be attained in the predetermined temperature region for an upper part of the crystal. Thus, the production conditions of the present invention can be satisfied.

As the cooling apparatus for the crystal, an air cooling duct, water-cooled coil or the like may also be provided so that it should surround the crystal, thereby securing the desired temperature gradient.

Hereafter, specific embodiments of the present invention will be explained by referring to examples. However, the present invention is not limited to these.

EXAMPLE 1

In the pulling apparatus 30 shown in FIG. 6, 60 kg of raw material polycrystal silicon was charged into a 20-inch quartz crucible, and a silicon single crystal having a diameter of 6 inches and direction <100> was pulled at an average pulling rate of 0.60 mm/min (the length of the cylindrical portion of the single crystal ingot was about 85 cm).

The melt temperature of the silicon melt was controlled to be about 1420° C. An annular solid-liquid interface heat insulating material having a height of 10 cm was disposed so that a space having a height of 4 cm was provided between the melt surface and the lower end of the annular solid-liquid interface heat insulating material. The distance from the melt surface to the ceiling of the pulling chamber was set at 30 cm by adjusting the crucible-holding shaft, and an upper surrounding heat insulating material was provided.

Then, a crystal was pulled while the F/G value at the crystal center portion was controlled to be 0.135 mm$^{2\cdot °}$C./min.

The crystal was pulled so as to receive during the pulling such a thermal history that the time required for the crystal to pass through the temperature range of 900 to 600° C. should be 645 minutes (accumulated value of passing times for each crystal temperature interval of 100° C.: 900–800° C./210 minutes, 800–700°C./210 minutes, 700–600° C./225 minutes, total 645 minutes) as shown by Curve A in FIG. 2 (plotted with solid squares). Wafers were cut out from the obtained single crystal ingot, and subjected to a mirror surface processing to prepare mirror surface wafers of silicon single crystal, and their grown-in defects were measured. Further, the wafers were subjected to a single-step thermal oxidation treatment or two-step thermal oxidation treatment, and generation of the OSF ring was confirmed.

The single-step thermal oxidation treatment was a usual OSF test, and it was performed by a method wherein the temperature was elevated under wet oxygen atmosphere, maintained at 1150° C. for 100 minutes, and then lowered.

If OSFs are generated in this test, device characteristics would be adversely affected.

The two-step thermal oxidation treatment was performed by a method wherein the temperature was maintained at 1000° C. for 3 hours under oxygen atmosphere as the first step, and the temperature was elevated from 1000° C. to 1150° C. under wet oxygen atmosphere, maintained at 1150° C. for 100 minutes, and then lowered for the second step.

As a result, it was found that the wafers were wafers with no defect, which had the N-region having no grown-in defects for the entire plane and did not generate an OSF ring by the single-step thermal oxidation treatment. An OSF ring was generated by the two-step thermal oxidation treatment, but OSFs in this case did not affect the device characteristics.

The oxide dielectric breakdown voltage of these wafers was 100% in terms of C-mode good chip yield. The conditions for the C-mode measurement were as follows.

1) Oxide film thickness: 25 nm,
2) Measurement electrode: phosphorus-doped polysilicon
3) Electrode area: 8 mm$^2$,
4) Current density in decision: 1 mA/cm$^2$
5) Good chip judgement: one exhibiting a dielectric breakdown electric field of 8 MV/cm or higher was judged as a good chip.

EXAMPLE 2

A crystal was pulled under the same conditions as those of Example 1 except that the oxygen concentration in the growing crystal was gradually lowered from 27.5 ppma to 20.0 ppma during the pulling of the single crystal. Wafers were cut out from the obtained single crystal ingot, and subjected to a mirror surface processing to prepare a mirror surface wafer of silicon single crystal, and their grown-in defects were measured. Further, the wafers were subjected to a thermal oxidation treatment, and generation of OSF ring was confirmed.

As a result, wafers with extremely few defects, in which the N-region with no grown-in defects was enlarged to the maximum extent over the entire plane although latent nuclei for the OSF exist, could be obtained even for wafers having the oxygen concentration of 24.0 ppma or more. The oxide dielectric breakdown voltage of these wafers was 100% in terms of C-mode good chip yield.

Comparative Example

A crystal was pulled under the same conditions as those of Example 1 except that the crystal was received such a thermal history that the time required for the crystal to pass through the temperature range of 900 to 600° C. should be 770 minutes (accumulated value of passing times for each crystal temperature interval of 100° C.: 900–800° C./240 minutes, 800–700° C./250 minutes, 700–600° C./280 minutes, total 770 minutes) as shown by Curve B in FIG. 2 (plotted with solid circles). Wafers were cut out from the obtained single crystal ingot, and subjected to a mirror surface processing to prepare a mirror surface wafer of silicon single crystal, and their grown-in defects were measured. Further, the wafers were subjected to a thermal oxidation treatment, and generation of OSF ring was confirmed.

As a result, a OSF ring was generated by the thermal oxidation treatment. The portions inside and outside the OSF ring consisted of N-regions with no grown-in defects over the entire planes of the portions.

The present invention is not limited to the embodiments described above. The above-described embodiments are mere examples, and those having the substantially same structure as that described in the appended claims and providing the similar functions and advantages are included in the scope of the present invention.

For example, the aforementioned embodiments were explained for cases where silicon single crystals having a diameter of 6 inches were grown. However, the present invention is not limited to them, and can also be applied to silicon single crystals having a diameter of 8–16 inches or larger. Further, the present invention can of course be used for the so-called MCZ method in which a horizontal magnetic field, vertical magnetic field, cusp magnetic field or the like is applied to silicon melt.

What is claimed is:

1. A method for producing a silicon single crystal, wherein, when a silicon single crystal is grown by the Czochralski method, the crystal is pulled with such conditions as present in a region defined by a boundary between a V-rich region and an N-region and a boundary between an N-region and an I-rich region in a defect distribution chart showing defect distribution which is plotted with D [mm] as abscissa and F/G [mm$^2$/° C.·min] as ordinate, wherein D represents a distance between center of the crystal and periphery of the crystal, F [mm/min] represents a pulling rate and G [° C./mm] represents an average temperature gradient along the crystal pulling axis direction in the temperature range of from the melting point of silicon to 1400° C., and time required for crystal temperature to pass through the temperature region of from 900° C. to 600° C. is controlled to be 700 minutes or shorter.

2. The method for producing a silicon single crystal wafer according to claim 1, wherein, when the silicon single crystal is grown by the Czochralski method, oxygen concentration in the growing crystal is controlled to be 24.0 ppma or less.

3. A silicon single crystal wafer produced from a silicon single crystal produced by the production method according to claim 2.

4. A silicon single crystal wafer produced from a silicon single crystal produced by the production method according to claim 1.

5. A silicon single crystal wafer grown by the Czochralski method, which is a silicon single crystal wafer having N-region for its entire plane, and does not generate OSFs by a single-step thermal oxidation treatment, but generates OSFs by a two-step thermal oxidation treatment.

6. A silicon single crystal wafer in accordance with claim 4, which contains crystal portions in which oxygen is not precipitated among crystal portions in which oxygen is precipitated by an oxygen precipitation heat treatment.

* * * * *